United States Patent
Dalton

(10) Patent No.: US 6,748,347 B1
(45) Date of Patent: *Jun. 8, 2004

(54) METHOD AND APPARATUS FOR RAPIDLY EVALUATING DIGITAL DATA PROCESSING PARAMETERS

(75) Inventor: Michael Dalton, Laguna Beach, CA (US)

(73) Assignee: Voxel, Inc., Provo, UT (US)

( * ) Notice: Subject to any disclaimer, the term of this patent is extended or adjusted under 35 U.S.C. 154(b) by 459 days.

This patent is subject to a terminal disclaimer.

(21) Appl. No.: 09/668,394

(22) Filed: Sep. 22, 2000

Related U.S. Application Data

(63) Continuation of application No. 08/757,557, filed on Nov. 27, 1996, now Pat. No. 6,123,733.

(51) Int. Cl.⁷ .............................................. G06F 17/50
(52) U.S. Cl. ........................... 703/5; 382/210; 382/276; 345/426
(58) Field of Search ........................ 703/2, 5; 324/307; 382/210, 254, 276; 359/22; 345/426

(56) References Cited

U.S. PATENT DOCUMENTS

| | | | |
|---|---|---|---|
| 4,831,528 A | 5/1989 | Crawford et al. | |
| 5,233,299 A | 8/1993 | Souza et al. | |
| 5,315,512 A | 5/1994 | Roth | |
| 5,361,385 A | 11/1994 | Bakalash | |
| 5,381,518 A | 1/1995 | Drebin et al. | |
| 5,396,890 A | 3/1995 | Weng | |
| 5,544,283 A | 8/1996 | Kaufman et al. | |
| 5,566,282 A | 10/1996 | Zuiderveld | |
| 5,592,313 A | 1/1997 | Hart | |
| 5,675,437 A | 10/1997 | Hart et al. | |
| 5,796,500 A | * 8/1998 | Hart ............................. 359/24 |
| 5,796,873 A | * 8/1998 | Deane ......................... 382/254 |
| 6,123,733 A | * 9/2000 | Dalton ............................. 703/5 |

* cited by examiner

Primary Examiner—Samuel Broda
Assistant Examiner—Thai Phan
(74) Attorney, Agent, or Firm—Snell & Wilmer L.L.P.

(57) ABSTRACT

The present invention includes a method and apparatus for simulating, for example on a desktop computer, a specific view of a hologram. A preferred embodiment of this invention suitably enables, in medical imaging, the manipulation of intensity transformations (windowing and leveling), regions (cropping) and views (axial, coronal and lateral) and the display of the resulting simulations in substantially real time.

In accordance with one aspect of the present invention, an approximation of substantially accurate pixel intensities is achieved by collapsing three-dimensional data onto a two-dimensional view, without the need for constructing complex summations of fringe patterns, as is typically required when constructing a hologram. A power function is suitably applied to each voxel in the data set. The values for a particular x, y coordinate are then summed along the z axis, with the resultant sum value being stored in a sum buffer for all values of x and y. The maximal value of the sum buffer is determined, then the sum buffer values are normalized by this maximum value. Finally, an inverse power function is applied to the normalized sum, then the results are scaled over the range of values of the output buffer. Consequently, the operator is able to view, in substantially real time, simulations of a single view of a hologram created from the selected parameters.

38 Claims, 6 Drawing Sheets

METHOD AND APPARATUS FOR RAPIDLY EVALUATING DIGITAL DATA PROCESSING PARAMETERS

RELATED APPLICATION

This application is a continuation of U.S. patent application Ser. No. 08/757,557 filed Nov. 27, 1996, U.S. Pat. No. 6,123,733.

TECHNICAL FIELD OF THE INVENTION

This invention generally relates to digital data processing, and more particularly, to a method and apparatus for rapid evaluation of digital data processing parameters.

BACKGROUND OF THE INVENTION

A hologram is a three-dimensional record, (e.g., a film record) of a physical system which, when replayed, produces a true three-dimensional image of the system. Holography differs from stereoscopic photography in that a holographic image exhibits full parallax by affording an observer a full range of viewpoints of the image from every angle, both horizontal and vertical, and full perspective (i.e. it affords the viewer a full range of perspectives of the image from every distance from near to far). A holographic representation of an image thus provides significant advantages over a stereoscopic representation of the same image. This is particularly true in medical diagnosis, where the examination and understanding of volumetric data is critical to proper medical treatment.

While the examination of data which fills a three-dimensional space occurs in all branches of art, science, and engineering, perhaps the most familiar examples involve medical imaging where, for example, Computerized Axial Tomography (CT or CAT), Magnetic Resonance (MR), and other scanning modalities are used to obtain a plurality of cross-sectional images of a human body part. Radiologists, physicians, and patients observe these two-dimensional data "slices" to discern what the two-dimensional data implies about the three-dimensional organs and tissue represented by the data. The intergration of a large number of two-dimensional data slices places great strain on the human visual system, even for relatively simple volumetric images. As the organ or tissue under investigation becomes more complex, the ability to properly integrate large amounts of two-dimensional data to produce meaningful and understandable three-dimensional mental images may become overwhelming.

Presently known modalities for generating volumetric data corresponding to a physical system include, inter alia, computerized axial tomography (CAT or CT) scans, magnetic resonance scans (MR), three-dimensional ultra sound (US), positron emission tomography (PET), and the like. Although a preferred embodiment of the present invention is described herein in the context of medical imaging systems which are typically used to investigate internal body parts (e.g., the brain, spinal cord, and various other bones and organs), those skilled in the art will appreciate that the present invention may be used in conjunction with any suitable data set defining any three-dimensional distribution of data, regardless of whether the data set represents a physical system, e.g., numerical, graphical, and the like.

Typical data sets comprise on the order of 10 to 70 (for CT systems) or 12 to 128 (for MR) two-dimensional data slices 14. Those skilled in the art will appreciate that the thickness and spacing between data slices 14 are configurable and may be adjusted by the CT technician. Typical slice thicknesses range from 1.5 to 10 millimeters and most typically approximately 5 millimeters. The thickness of the slices is desirably selected so that only a small degree of overlap exists between each successive data slice.

The data set corresponding to a CT or MR scan is typically reproduced in the form of a plurality (e.g., 50–100) of two-dimensional transparent images which, when mounted on a light box, enable the observer (e.g., physician) to view each data slice. By reviewing a plurality of successive data slicers 14, the observer may construct a three-dimensional mental image or model of the physical system within volume 16. The accuracy of the three-dimensional model constructed in the mind of the observer is a function of the level of skill, intelligence, and experience of the observer and the complexity and degree of abnormality of the body parts within volume 16.

In addition to the use of an angled gantry, other techniques may be employed to produce a data set in which a plane of each data slice is not necessarily parallel to the plane of every other data slice, or not necessarily orthogonal to the axis of the data set; indeed, the axis of the data set may not necessarily comprise a straight line. For example, certain computerized techniques have been developed which artificially manipulate the data to produce various perspectives and viewpoints of the data, for example, by graphically rotating the data. In such circumstances, it is nonetheless possible to replicate the three-dimensional data set in the context of the present invention. In particular, by carefully coordinating the angle at which the object beam is projected onto the film, the plane of a particular data slice may be properly oriented with respect to the plane of the other data slices and with respect to eh axis of the data set, for example by tilting screen 326 about its horizontal or vertical axis. Presently known CT scan systems generate data slices having a resolution defined by, for example, a 256 or a 512 square pixel matrix. Furthermore, each address within the matrix is typically defined by a twelve bit grey level value. CT scanners are conventionally calibrated in Houndsfield Units whereby air has a density of minus 1,000 and water a density of zero. Thus, each pixel within a data slice may have a grey level value between minus 1,000 and 3,095 (inclusive) in the context of a conventional CT system. Because the human eye is capable of simultaneously perceiving a maximum of approximately one hundred (100) grey levels between pure white and pure black, it is desirable to manipulate the data set such that each data point within a slice exhibits one (1) of approximately fifty (50) to one hundred (100) grey level values (as opposed to the 4,096 available grey level values). The process of redefining these grey level values is variously referred to as "windowing".

The present inventor has determined that optimum contrast may be obtained by windowing each data slice in accordance with its content. For example, in a CT data slice which depicts a cross-section of a bone, the bone being the subject of examination, the relevant data will typically exhibit grey level values in the range of minus 600 to 1,400. Since the regions of the data slice exhibiting grey level values less than minus 600 or greater than 1,400 are not relevant to the examination, it may be desirable to clamp all grey level values above 1,400 to a high value corresponding to pure white, and those data points having grey level values lower than minus 600 to a low value corresponding to pure black.

As a further example, normal grey level values for brain matter are typically in the range of about 40 while grey level-values corresponding to tumorous tissue may be in the 120 range. If these values were expressed within a range of 4,096 grey level values, it would be extremely difficult for the human eye to distinguish between normal brain and tumorous tissue. Therefore, it may be desirable to clamp all data points having grey level values grater than, e.g., 140 to a very high level corresponding to pure white, and to clamp those data points having grey scale values of less than, e.g. minus 30, to a very low value corresponding to pure black. Windowing the data set in this manner contributes to the production of sharp, unambiguous holograms.

In addition to windowing a data set on a slice-to-slice basis, it may also be advantageous, under certain circumstances, to perform differential windowing within a particular slice, i.e. from pixel to pixel. For example, a certain slice or series of slices may depict a deep tumor in a brain, which tumor is to be treated with radiation therapy, for example by irradiating the tumor with one or more radiation beams. In regions which are not to be irradiated, the slice may be windowed in a relatively dark manner. In regions which will have low to mid levels of radiation, a slice may be windowed somewhat more brightly. In regions of a high concentration of radiation, the slice may be windowed even brighter. Finally, in regions actually containing the tumor, the slice may be windowed the brightest.

Diagnostic imaging modalities (i.e. computerized tomography, computerized tomographic angiography, magnetic resonance, magnetic resonance angiography, ultrasound, digital subtraction angiography, etc.) typically acquire complex digital data which is usually, when displayed or printed, processed to map the large dynamic range of the scanner data (typically 12-bit) to that of the display device (typically 8-bits). Processing of the digital data often includes subjecting the data to various control parameters (i.e. windowing, leveling, cropping, etc.) to enhance the clinical utility of the digital data. The data is usually processed in the form of digital images and can contain from one to several hundred individual two-dimensional digital images (called "slices") in a single volumetric data set.

Typically, a representative digital image through the anatomy is chosen and the control parameters are applied and adjusted to maximize the resulting imagery. The feedback of the results is usually as rapid as possible to aid the real-time adjustment of the control parameters. The chosen control parameters may need to be adjusted for each displayed image or one set of control parameters is often applied through all of the acquired slices. The results are then typically printed to aid diagnosis by the physician or to form a medical record.

Prior art methods exist for displaying representations of slices of processed digital data; however, the operator oftentimes must mentally reconstruct the two-dimensional slices into a volumetric image using his existing knowledge of anatomy. Furthermore, adjusting the parameters of each slice of data, and thereafter combining the slices does not usually adequately reflect the composite parameters for the entire volume of data. Displaying accurate representations of entire volumes ("volume rendering") of processed digital data is often much more advantageous in that the final picture contains substantial information about every data element within a data volume. If an operator could receive feedback on the effects of selected parameters on the entire resulting volume of digital data, the operator would be able to produce significantly better diagnostic images. Because of the lack of availability of real-time volumetric imaging devices, the two-dimensional projections of the volumetric data that can be computed in real-time are often used to select these parameters. To the extent these parameters are used to produce a static three-dimensional holographic print, the projection of the volumetric data should desirably simulate a view of the hologram.

Projections of the effects of changing parameters on the volumetric data has often been attempted through the use of maximum intensity projections (MIPs), simple averages, threshold averages, opacity functions and/or the like. Each of these methods only provide substantially accurate simulations of the volumetric data under certain conditions and may require significant computer processing power to execute in real-time. For example, averages often provide substantially accurate simulations for very wide windows, while MIPs often provide substantially accurate simulations for very narrow windows of sparse vascular data. Opacity functions are usually used to collapse the image by assigning colors to different tissue classifications according to some previously defined intensity level ranges. In an opacity function, the light flux reflected by the tissue is combined with the light flux transmitted through the tissue. A problem that normally exists is that, for each voxel to have some effect on the final picture, the voxel typically must absorb or scatter some of the rays passing through it without concealing the voxels which lie behind it. However, an opacity function typically calculates the light flux from hypothetical light reflections without the use of actual raw data. A method and apparatus are needed which assigns intensity values to volumetric raw data.

A maximum intensity projection (MIP) is typically a ray casting technique whereby parallel rays are passed from an arbitrarily chosen viewing direction through a full data set. An intensity value is usually calculated for each voxel which is intersected along the ray. The MIP usually proceeds along the ray and compares the intensity values of successive pixels along the array to determine the pixel with the maximum intensity value. Only the maximum intensity value is typically used for the final image at the viewing plane. More particularly, if N is the number of sections of reformations from any one projection, the MIP algorithm typically eliminates all but 1/N, thus retaining approximately 1–2% of the full data set. Thus, the MIP algorithm usually retains, for each MIP projection, only that voxel which appears brightest from a predetermined viewing direction.

However, use of the MIP algorithm typically assumes that the brightest voxels are the most diagnostically important pieces of information. This assumption can oftentimes lead to dangerous results, i.e. a collapsed MIP may superimpose a scalp branch of an external carotid artery onto a brain parenchyma as if it were an intrinsic vessel, when in fact there may be no such connection. Moreover, lower intensity features of MIP images are often lost, leading to, for example, an apparent reduction in vessel diameter, an overestimation of blood turbulence or stenosis and a loss of visualization of smaller slow flowing vessels. Additionally, voxels at an interface may not exclusively belong to one object or another, so their intensity value represents an average of all the material located near that position. Threshold intensity values are typically set to manipulate the volume data at the interface, but the variation in the threshold values may result in artifacts. Therefore, MIPs typically do not provide consistent accurate feedback on the effects of selected parameters on the entire resulting volume of digital data. To produce better holographic images, a method and apparatus for providing accurate feedback on the effects of selected parameters is needed.

SUMMARY OF THE INVENTION

The present invention includes a method and apparatus for simulating, for example on a desktop computer, a specific view of a hologram. A preferred embodiment of this invention suitably enables, in medical imaging, the manipulation of intensity transformations (windowing and leveling), regions (cropping) and views (axial, coronal and lateral) and the display of the resulting simulations in substantially real time.

In accordance with one aspect of the present invention, an approximation of substantially accurate pixel intensities is achieved by collapsing three-dimensional data onto a two-dimensional view, without the need for constructing complex summations of fringe patterns, as is typically required when constructing a hologram. A power function is suitably applied to each voxel in the data set. The values for a particular x, y coordinate are then summed along the z axis, with the resultant sum value being stored in a sum buffer for all values of x and y. The maximal value of the sum buffer is determined, then the sum buffer values are normalized by this maximum value. Finally, an inverse power function is applied to the normalized sum, then the results are scaled over the range of values of the output buffer. Consequently, the operator is able to view, in substantially real time, simulations of a single view of a hologram created from the selected parameters.

BRIEF DESCRIPTION OF THE DRAWING FIGURES

Preferred exemplary embodiments of the present invention will hereinafter be described in conjunction with the appended drawing figures, wherein like numerals denote like elements and:

DETAILED DESCRIPTION OF PREFERRED EXEMPLARY EMBODIMENTS

An apparatus and method according to various aspects of the present invention is suitably configured to approximate a monocular view of a hologram by collapsing (on a desktop computer) three dimensional data into two-dimensional data, without the need for constructing complex summations of fringe patterns. The present invention is applicable to the simulation of any volumetric data set; however, in preferred exemplary embodiments, the present simulation is suitably applied to holographic images useful in connection with the method and apparatus for making holograms as disclosed in U.S. patent application Ser. No. 08/323,568 by Hart, filed Oct. 17, 1994. Furthermore, the volumetric data sets, as discussed herein, are not limited to medical data sets or to the simulation of holograms as described in the Hart patent application. For example, the representation of data may include colors of various anatomical features or very large data sets.

Equation (1) is a symbolic representation of the data processing techniques embraced by the present invention.

$$I_{x,y} = \left( \frac{\sum_n (I_{x,y}^{K_1} + N_f)}{max_{x,y}\left(\sum_n (I_{x,y}^{K_1} + N_f)\right)} \right)^{1/K_2} \times R \quad (1)$$

Figure 1:
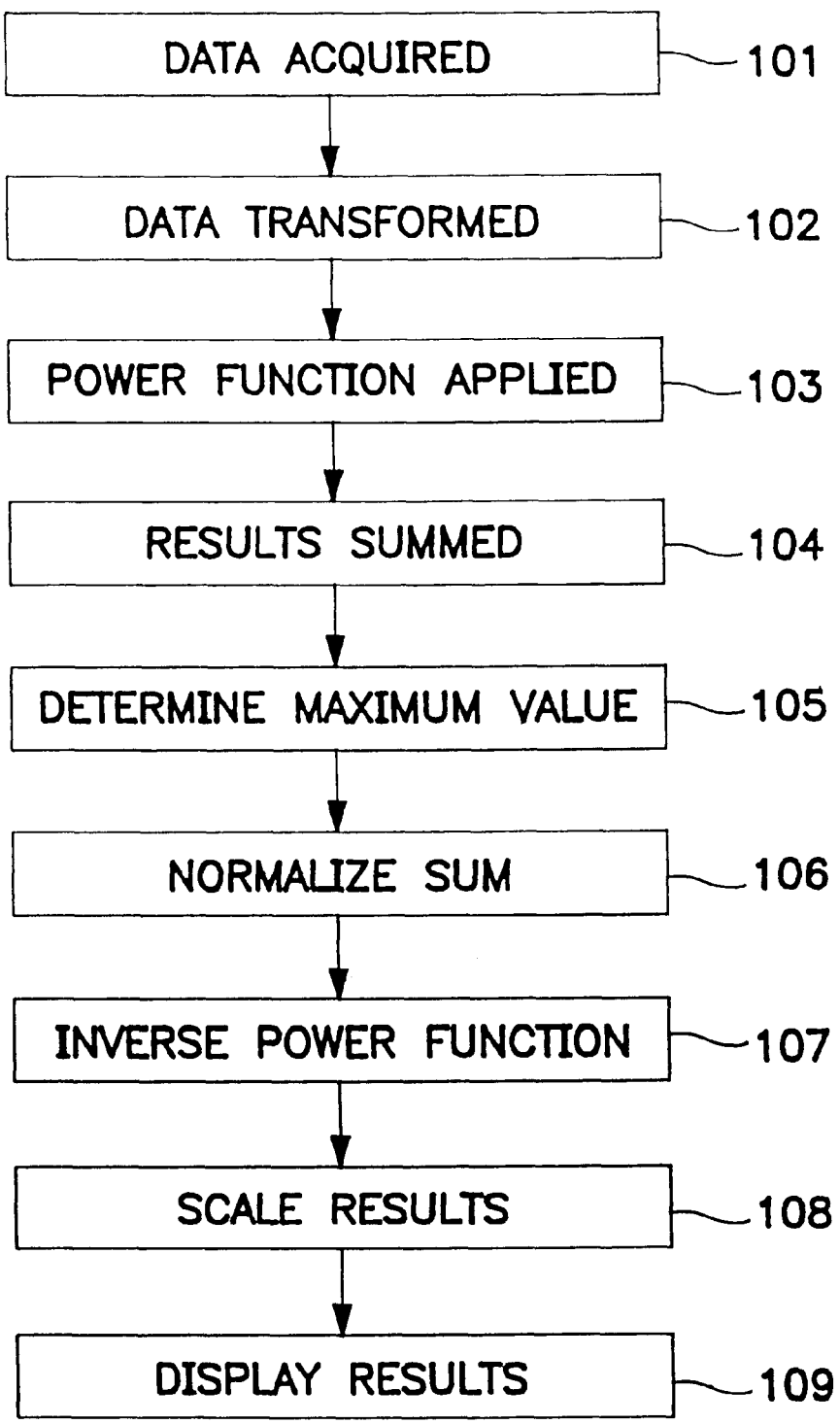
FIG. 1 shows an exemplary flow diagram of the general process of the present invention.

With reference to FIG. 1, a flow diagram shows preferred general steps (operations) for implementing equation (1) to thereby simulate a view of a holographic image. Digital pre-processed data 5 is suitably acquired (step 101) and transformed via an intensity function (step 102). In particular, the volumetric data set is suitably expressed as a plurality of two dimensional data slices, each comprising a plurality (e.g. 256×256; 512×512) of pixels; each pixel has an associated intensity value expressed as, for example, a 12-bit number. A power function is suitably applied to each incoming data point (pixel) (step 103) and the results summed for each pixel having the same x, y coordinate along the z axis (step 104) (in this context, "z" corresponds to the axis which extends "through" the data set, i.e., the z axis is essentially orthogonal to each data slice in a typical volumetric data set). The maximal value of the sums is suitably determined (step 105) and each sum is thereafter normalized by this maximum value (step 106). An inverse power function is suitably applied to the normalized sums (step 107) and the results are preferably scaled over the range of values of the output buffer (step 108). The normalized, scaled sums are then suitably displayed (step 109) on a monitor for viewing by the operator.

The general flow diagram of FIG. 1 may be implemented in any number of ways; in the context of the present invention, two different embodiments are described in detail. A first embodiment corresponds to a basic implementation of the present invention described herein in the context of the process of FIG. 3 and the apparatus 1 of FIG. 2a to generate a simulation of a holographic image from a predetermined set of parameters. Using a predetermined set of parameters, the first embodiment is particularly useful with data sets having a fixed configuration of control parameters (windowing, leveling, cropping, etc.), and thus does not require preprocessing hardware (as compared to computer system 12 of FIG. 2b discussed below). However, the reduced number of elements in the first embodiment may result in a longer processing time for obtaining a simulation. Therefore, an exemplary first embodiment is preferably used when a simulation is not immediately needed (e.g., where the simulation is to be printed on a hardcopy). Alternatively, a second embodiment, described herein in the context of the process of FIG. 4 and the expanded apparatus 3 of FIG. 2b, suitably includes a preprocessing module, and is thus configured to substantially decrease the processing time associated with the production of holographic simulations. With reference to FIG. 2b, apparatus 3 (an exemplary second embodiment) further includes a secondary storage 6, a 3-D input buffer 9, an LUT 13, a sum register 16 (as part of processor 11), a controller 20 and an LUT 14. Apparatus 3 (the second embodiment) suitably allows the operator to interactively manipulate parameters and preferably view, in substantially real time, the resulting simulations of the holograms, thereby allowing the operator to dynamically select optimum parameters interactively without the need for creating the actual holograms.

Figure 2A:
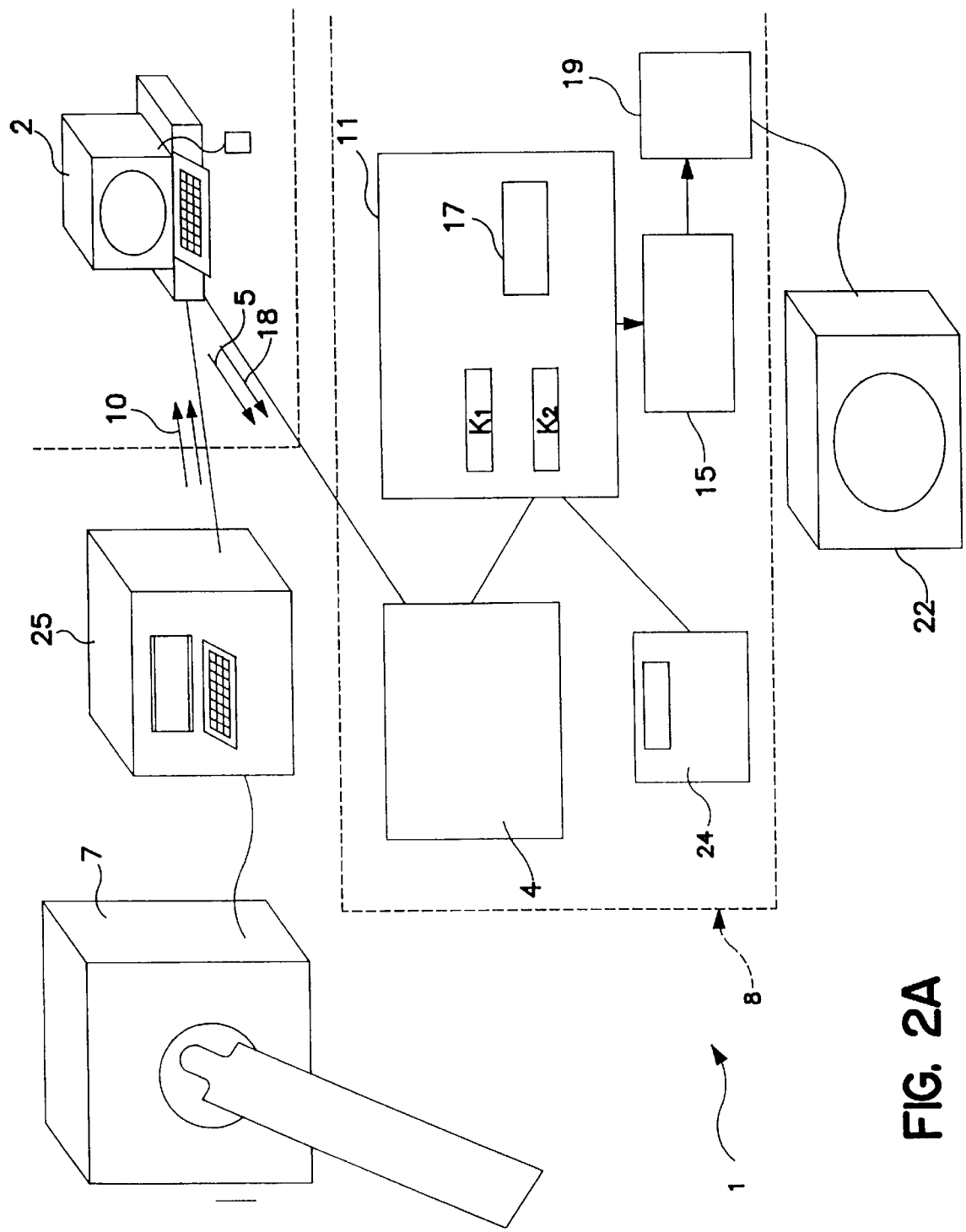
FIG. 2a shows a diagram of an exemplary apparatus for a first embodiment of the present invention.
Figure 2B:
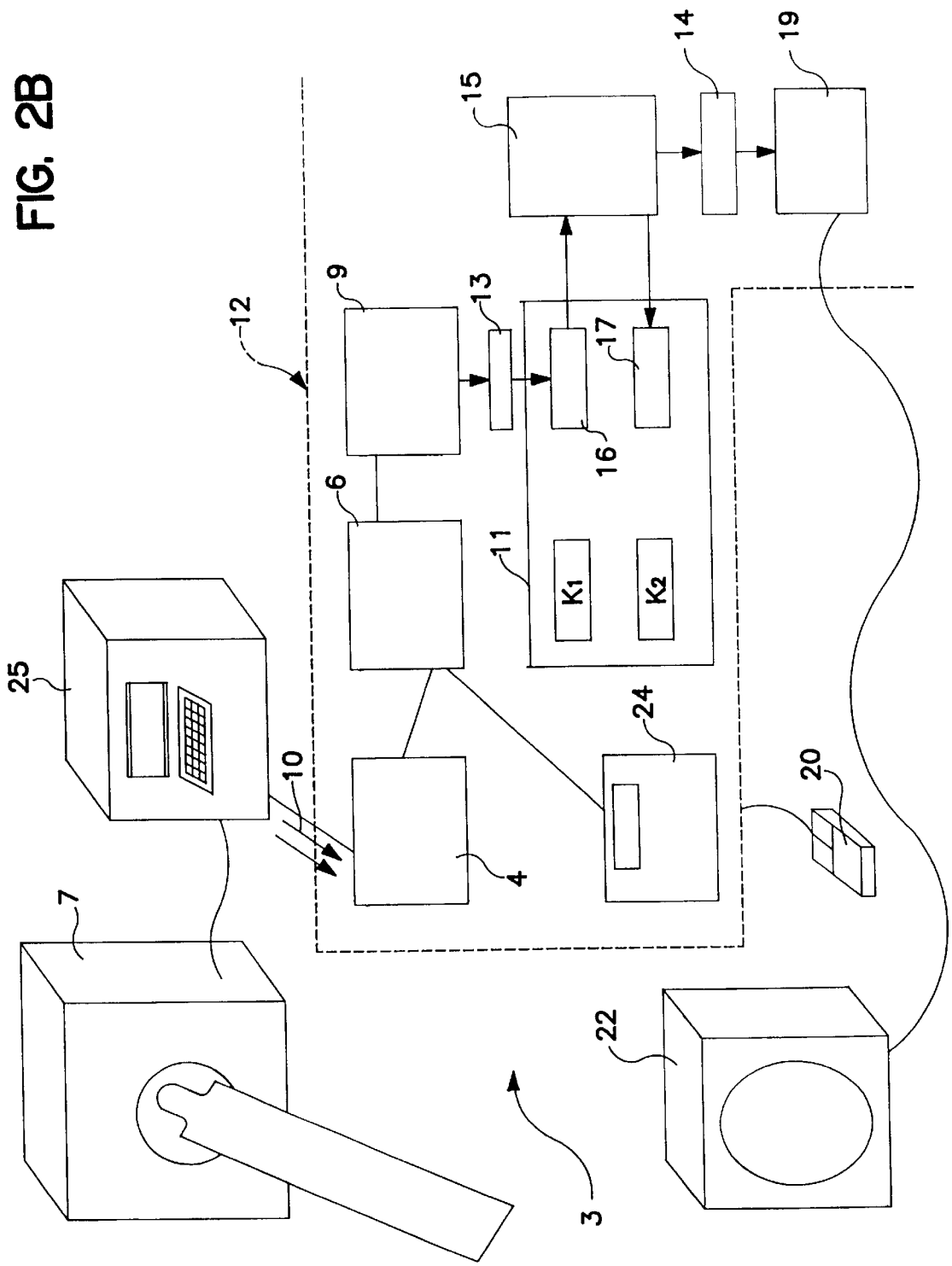
FIG. 2b shows a diagram of an exemplary apparatus for a second embodiment of the present invention.

More particularly, with reference to FIG. 2a, in accordance with a first embodiment, an exemplary processing system 1 preferably includes, inter alia, a scanner 7, a workstation 2 configured to transmit digital pre-processed data 5 to a computer system 8, and a display device 22. Computer system 8 preferably includes a processor 11, a network interface 4, a 2-D sum buffer 15, and an output buffer 19. Processor 11 preferably includes a maximum value register 17, along with other known CPU functions. Sum buffer 15 is preferably a two-dimensional floating point array. Output buffer 19 is preferably a two dimensional array of displayable color indices. In an alternative embodiment, network interface 4 may be replaced with or augmented by a removable digital storage reader 24. In another alternative embodiment, display device 22 may be replaced by or supplemented with a 2-D printer.

Figure 3:
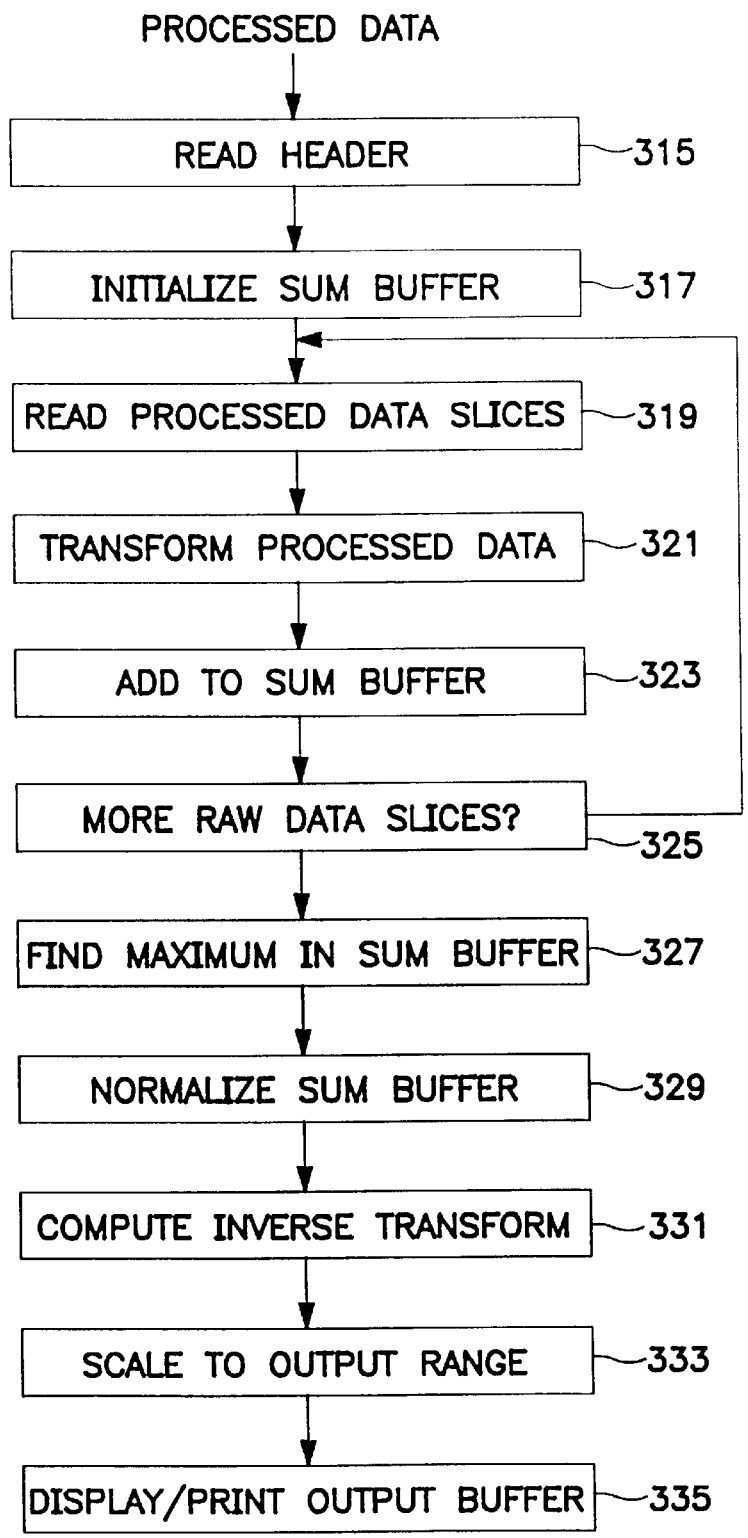
FIG. 3 shows an exemplary flow diagram of a first embodiment of the present invention.

With reference to FIG. 3 and FIG. 2a, scanner 7 is suitably configured to scan or otherwise interrogate a subject, for example a human body, and thereby generate a data set corresponding to an image representative of the scanned subject. The data set is then formatted by a suitable scanning computer 25, which may be integral with, connected to, or otherwise operatively associated with scanner 7.

The data set formatted by computer 25 is referred to as unprocessed (or raw) data 10, in the sense that it has not yet been preprocessed to accommodate windowing, leveling, cropping, or the like. Unprocessed data 10 is suitably transmitted from scanning computer 25 to preprocessing workstation 2, for example a PC. Inasmuch as scanning consol 25 is typically occupied with controlling and performing scanning functions, workstation 2 (e.g. on independent consol) is often used to off-load the computationally intensive processing of raw data 10 from scanner 7. In a preferred embodiment, workstation 2 suitably converts raw data 10 into processed data 5, for example by organizing the data as a sequence of (n) sequential data slices, each slice comprising a two-dimensional matrix of pixels, with each pixel having an associated intensity value. Moreover, processed data 10 reflects any intensity functions (e.g. window and leveling) and/or cropping which may have been applied to the data set by the operator, e.g. via workstation 2. Furthermore, digital pre-processed data 5 is preferably limited to positive values and preferably includes a header 18 portion containing various formatting indicia, for example the x and y dimensions in each slice, the number of slices in the volumetric data set, and the like. In a preferred embodiment, all slices comprising the data set are of the same dimension, each voxel is suitably expressed as a fixed bit string. Sum buffer 15 suitably consists of an array of floating point representations with a sufficiently large range to accommodate data sets of the type used in various medical imaging modalities. In an alternative embodiment, voxel values may be pre-scaled (normalized) before the power function is applied to ensure that no elements in sum buffer 15 overflow (i.e., to ensure that the bit length of the sum buffer "registers" is large enough to accommodate the fixed bit length data.)

To initialize the simulation, processor 11 suitably reads header portion 18 (step 315) of each voxel, and initializes sum buffer 15 to the dimensions of the incoming slices and to set all the values of sum buffer 15 to zero (0.0) (step 317). After reading header 18, the voxel values of the slices of digital pre-processed data 5 are read (step 319) and a power function $K_1$ is preferably applied to the data value (intensity) associated with every incoming voxel, thereby raising the value of each voxel intensity representation to the $K_1$ power, thus transforming data 5 (step 321). For each x, y coordinate point, successive transformed data values are sequentially added to the corresponding register in sum buffer 15 (step 323), such that pixel x, y value for successive slices is suitably added to sum buffer. This process is preferably repeated until all x, y coordinate voxels for all (n) slices are added into sum buffer 15 (step 325). Through this process, the summing of the intensity contributions converts the three-dimensional array of pre-processed data 5 into a two-dimensional array of sums, as follows:

$$Sum_{x,y} = \sum_n \left(I_{x,y}^{K_1} + N_f\right) \tag{2}$$

Once all digital pre-processed data 5 slices have been read into sum buffer 15, the maximum value in sum buffer 15 is suitably found (step 327) as follows:

$$Max = MAX(Sum_{x,y}) \tag{3}$$

To find the maximum value, a register variable (maximum value register 17) is preferably set to the first value in sum buffer 15. Then, all the other sum buffer values are suitably compared to maximum value register 17. If sum buffer value 15 is greater than maximum value register 17, sum buffer value 15 is suitably set as the new maximum value register 17. In a preferred embodiment, maximum value register 17 is a floating point maximum value register.

After determining the maximum sum buffer value 17, sum buffer 15 suitably normalizes sum buffer 15 with the maximum value by dividing all the values in sum buffer 15 by maximum value register 17 (step 329) as follows:

$$Normalized_{x,y} = \frac{(Sum_{x,y})}{Max} \tag{4}$$

Next, processor 11 suitably computes the inverse power function (step 331) for all of the normalized sum buffer 15 values by raising the values as follows:

$$Inverse_{x,y} = (Normalized_{x,y})^{1/K_2} \tag{5}$$

Processor 11 then suitably scales the resulting sum buffer 15 values to the desired output range of the display (step 333), whereby R is the dynamic range of the grey scale display, as follows:

$$Output_{x,y} = Inverse_{x,y} \times R \tag{6}$$

In a preferred embodiment, $K_1$ and $K_2$ produce the best results when $K_1$ and $K_2$ are about 2.8–5, but optimally, $K_1$ and $K_2$ are equal and have values of approximately 3.2. Finally, the scaled values are preferably sent to display device 22 (step 335), and/or alternatively, to a print buffer.

As mentioned, because of its longer processing time, apparatus 1 (first embodiment) is advantageous when a simulation is not immediately needed. Moreover, before a holographic simulation can be created, apparatus 1 requires pre-processed data 5 (unless raw data 10 exists in an optimal condition without the need for pre-processing). To obtain the necessary parameters for the pre-processing of raw data 10, an operator preferably chooses pre-processing parameters from a pre-established list. However, creating a pre-processed list is typically a slow process because numerous parameters are usually evaluated before the optimal simulation is discovered. Because the most processing intensive part of the first embodiment is the sequential addition of each image slice to sum buffer 15, thereby requiring n passes through sum buffer 15, substantial real time viewing with apparatus 1 requires excessive and expensive processing power.

Instead, if the operator can manipulate these parameters and view the resulting holographic simulations in substantial real time, the optimal solution can be obtained more rapidly. Real time manipulation enables the operator to rapidly assess numerous versions and select the optimal processing parameters for a particular data set. A diagnostically useful image needs to contain the optimal parameters so that any pathological anatomy, if present, is evident. Feedback from real time manipulation is also important for reducing undershooting and overshooting the selection of parameters. In medical imaging, for example, rapid selection of parameters minimizes the time required for the filming of diagnostic images.

A second exemplary embodiment of this invention suitably enables, in medical imaging, the manipulation of intensity transformations (windowing and leveling), the manipulation of regions (cropping) and the manipulation of views (axial, coronal and lateral), and the display of the resulting simulations, in substantially real time. Manipulation of intensity transforms (i.e., window and level in medical settings) is important for selecting and highlighting the tissues of diagnostic interest because the intensity values measured by scanner 7 represent certain tissue characteristics. An intensity transform is also used to map the intensity values to a displayable range because the intensity values of scanner 7 typically have a large dynamic range. Manipulation of regions removes tissue regions which would obscure or mask important anatomical regions from a particular view. Manipulation of views is important for selecting the view with the least obstruction of the important anatomy and for the selection of crop regions along a selected projection axis which can only be manipulated from alternative views. Manipulation of views also allows selection of standard radiological views, instead of being limited to the acquired view. The second embodiment (along with any other embodiments) are not, however, limited to applications within the field of medical imaging. In general, with reference to FIGS. 2b and 4, the aforementioned manipulations are achieved in substantial real time by adding processing steps and additional apparatus to the first embodiment (i.e., secondary storage 6, 3-D input buffer 9, LUT 13, sum register 16 (as part of processor 11), controller 20 and inverse LUT 14).

More particularly with respect to digital data 10, raw digital data 10 is representative of the three dimensional object features and substantially corresponds to transverse slices of the human body. Thus, raw digital data 10 includes a number of slices (n), whereby each slice contains a number of voxels. Raw digital data 10 from each of the voxels represents a scanned intensity ($I_{x,y,z}$) value of the portion of the physical feature (i.e., tissue, organ, bone) contained in the voxel. Because the voxels are distributed among three axes (x,y,z), projections along any one of these three axes produces one of three standard views. Because each axis can be viewed from either end, six natural views exist. Each view has four simple orientations which cause each voxel to map onto itself, so at least 24 ways exist for viewing a single set of the objects' raw digital data 10 by simple re-ordering of the voxels and projecting the data along one of the axes. With more complex and computationally intensive resampling procedures, any view of the data can be produced. When the present invention is applied to medical imaging of anatomy, three standard views along the axes (i.e., axial, coronal and lateral) are normally requested by physicians. An operator preferably manipulates views to see the projection of the crop region along any of the three axes and to view simulations of any of the views before recording in a print medium.

Consequently, raw digital data 10 is preferably reorganized to accurately represent the various views of the object. To rapidly apply the present algorithm, data 10 is preferably arranged in a planar, parallel volume. If the scanning cross-section is not perpendicular to the direction of motion of the object or scanner 7, then the slices need to form a perpendicular volume. If the scanner is not perpendicular to the translation direction, data slices 10 need to be extended and arranged (in object space) to form a planar, perpendicular volume. For example, when gantry tilt exits, the image is inputted into input buffer 9 such that the image is displaced into the volume by a predetermined amount corresponding to its depth down the z-axis. Thus, reading from secondary storage is faster than reading from scanner 7 through network interface 4.

To achieve substantial real time viewing of simulations without the need for excessive and expensive processing power, the most processing intensive part of the first embodiment (the transform and addition of raw digital data 10 to sum buffer 15) must be made more efficient. To allow for the efficient access of its memory locations by processor 11 and to reduce the number of passes (n) through sum buffer 15, apparatus 3 (second embodiment) preferably includes 3-D input buffer 9 and sum register 16 (as part of processor 11) within computer system 12. Reordering of raw digital data 10 into 3-D input buffer 9 allows for the efficient access to the voxels and reduces the n−1 accesses for each element of the sum buffer to one access by the use of sum register 16.

In particular, when summing the rays, the fastest varying index (i.e., indexing by a factor of 1 thereby incrementing from one voxel to the next voxel) typically determines the order that voxels are visited when the memory addresses of the voxels are incremented. For greater summing efficiency, raw digital data 10 (preferably read from secondary storage 6) is suitably rearranged such that the fastest varying index is not across a row of a single image, but instead, the fastest varying index is arranged down the stack of images to be summed. The rearrangement of incoming data 10 is suitably accomplished by rearranging the order of the voxels in memory such that the voxels are in a sequential order. After the voxels are in a sequential order, processor 11 sequentially accesses memory locations. Because sequential access of memory locations is a substantially faster process, the speed of the entire process is increased. Moreover, this rearrangement effectively eliminates the need to incorporate multiple passes through sum buffer 15. Multiple passes are not needed because the sequential arrangement is such that processor 11, while scanning through the volume, preferably works with each location in sum buffer 15 only once. Without a sequential arrangement, processor 11 would need to analyze random locations and indexes to determine their ranking, then return to the locations after determining their proper sequence. With the preferred sequential arrangement, processor 11 does not have to visit other locations and return to the index multiple times. In a single sum register 16, the actual value of the current sum is preferably stored rather than an address of the memory containing the current sum. In other words, when summing the rays with a single sum register 16, all of the slices for the voxels are traversed at a particular location. Moreover, reordering of raw digital data 10 allows for selection of views (as discussed above) because the choice of the fastest varying axis (z) determines the projection view selected (axial, coronal, lateral) while the choice of next fastest varying axis determines the orientation of the view.

With reference to FIG. 2b, a secondary embodiment preferably includes LUT 13 and inverse LUT 14. LUT 13 is an array of values representing the transformed values in 3-D input buffer 9 whereby the range of the data values in 3-D input buffer 9 is preferably known before LUT 13 is allocated. LUT 13 is a function of the window and level values and the power function K1 such that, in one step, LUT 13 rapidly implements the manipulation of the intensity function (window and level) and raises the power of the resulting transformed voxel in 3-D input buffer 9. Similar to LUT 13's implementation of complex functions (normalizing), LUT 14 and a binary search algorithm greatly simplify inverse transformations and the scaling of a pixel value in sum buffer 15 into display buffer 19.

Therefore, the second embodiment simplifies the most processing intensive part of the first embodiment by combining (a) a reordering process; (b) rapid access to input buffer 9; (c) elimination of the sequential addition of each image slice to sum buffer 15, and (d) LUTs 13, 14 to implement transformations. Thus, the second embodiment achieves substantial real time viewing of simulations without the need for excessive and expensive processing power. The aforementioned changes/additions are preferably accomplished by incorporating the additional apparatus of FIG. 2b and following the processing steps of FIG. 4.

Figure 4:
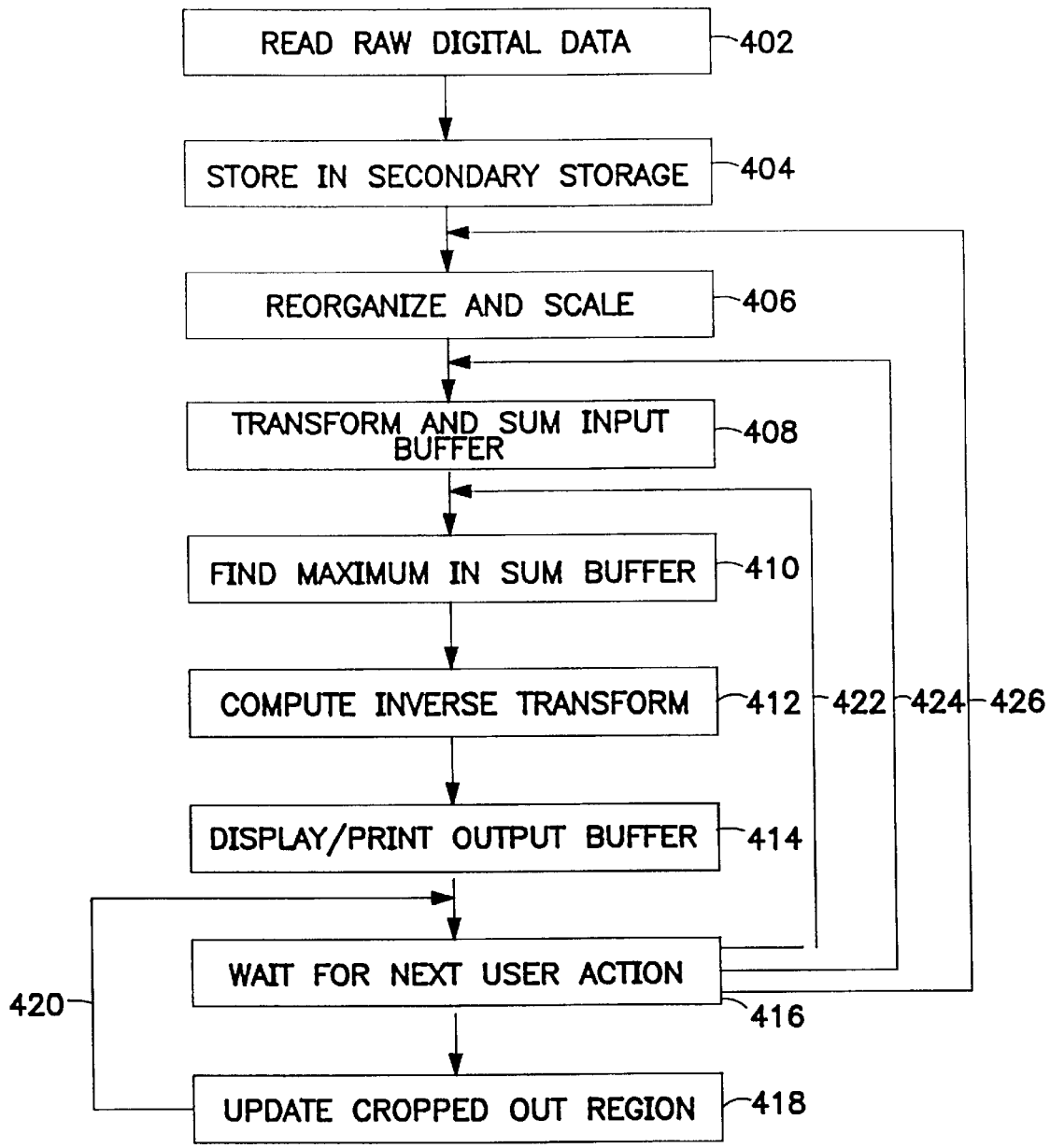
FIG. 4 shows an exemplary flow diagram of a second embodiment of the present invention.
Figure 5A:
FIG. 5A shows exemplary volumetric imagery produced by Maximum Intensity Projection (MIP)
Figure 5B:
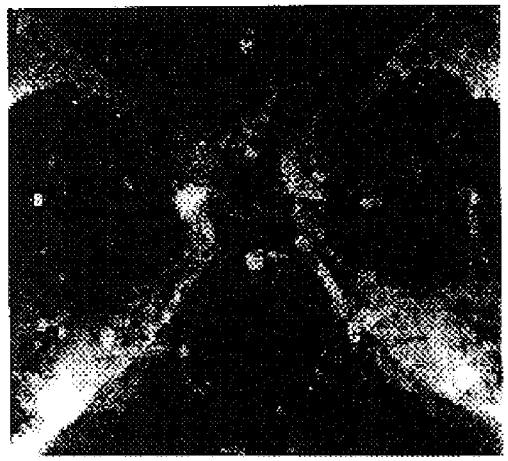
FIG. 5B shows exemplary volumetric imagery produced by Averaging.
Figure 5C:
FIG. 5C shows exemplary volumetric imagery produced in accordance with the present invention.
Figure 5D:
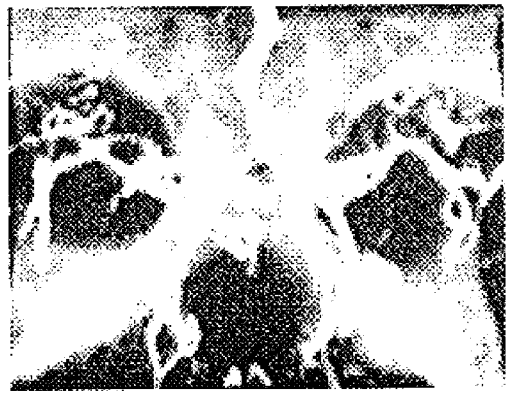
FIG. 5D shows a photograph of a holographic image of exemplary volumetric imagery.

FIG. 4 outlines the preferred processing steps for achieving substantial real time viewing of simulations. In a second embodiment, a suitable imaging device (scanner) 7 suitably collects and digitizes raw data values (processed by scanner 7, but not workstation 2), thereby creating digital data 10. Scanner 7 preferably includes, for example, computerized tomography, computerized tomographic angiography, magnetic resonance, magnetic resonance angiography, ultrasound, digital subtraction angiography, etc. In an alternative embodiment, scanner 7 is replaced by a computer simulation of a volumetric data set. In a preferred embodiment, digital data 10 is suitably re-read (step 402) numerous times from any suitable device (i.e., removable storage medium 24, network 4 and/or the like) and transferred into any suitable fast access secondary storage 6 (step 404) (i.e., fast access Random Access Memory (RAM), or fast access magnetic disk storage, or some combination thereof) Thus, system 12 rapidly re-reads raw digital data 10 and maps data 10 into any of the possible views, without raw digital data 10 being sent from scanner 7 over network 4 each time. In a preferred embodiment, network reader 4 reads digital data 10 and transfers digital data 10 onto secondary storage 6 which consists of fast access Random Access Memory (RAM).

Data 10 is preferably read from secondary storage 6, reorganized, scaled, then stored in 3-D input buffer 9 (step 406). In a preferred embodiment, the amount of digital data 10 is limited, thereby increasing the speed of the mapping process because of the reduction in excess processing. In the prior art, a LUT transforms digital data 10 several times a second, depending on the performance of processor 11. However, the more data that exists, the more data that must be transformed and/or processed in a given amount of time, so the refresh rate is sacrificed due to the increased quantity of data. With a large amount of data 10 in input buffer 9 and/or a slow processor 11, updates occur less frequently and real time refreshes of images are substantially sacrificed. A refresh rate depends on the number of possible voxels which may be processed per second (which depends on the processor) divided by the number of voxels needed for an adequate display (typically 256×256×60). A slow refresh rate typically results in measurable delays from the time a refresh is requested (i.e., movement of the windowing scroll bar) to the display of the refreshed image containing the adjusted parameter.

In the prior art, most diagnostic scanners routinely produce 12-bit image data 5, thereby typically requiring intensity processing ("windowing") before medical image data 10 can be presented to a viewer on an 8-bit gray scale CRT display. In a preferred embodiment, to reduce image data 10 to a manageable amount for a particular rate of processing, the number of slices is preferably limited by computing a smaller number of slices, reducing the size of each image and/or by a slabbing technique. The smaller number of slices are suitably computed by combining voxels from scanner 7. The size of each image is suitably reduced by such an amount that processor 11 can achieve some minimum refresh rate. For example, reducing an image size from 512×512 to 256×256 reduces the number of voxels by a factor of four, thereby increasing the refresh rate by a factor of four. With respect to the slabbing technique, when constructing a real hologram, slabbing typically limits the exposures and/or fringe patterns; therefore, when simulating a hologram, slabbing is similarly utilized to reduce data 5. When reducing data, slabbing preferably includes a mean threshold function whereby an average is suitably calculated. The mean threshold function is suitably calculated without including values below a predetermined threshold. In an alternative embodiment, slabbing includes a MIPing function which incorporates the brightest voxel within the slab.

With an increased refresh rate, apparatus 3 displays, in substantially real-time, a more accurate representation of intensity transformation parameters and almost any crop region while the parameters or regions are being adjusted. For example, in a preferred embodiment, the refresh rate is about four images/second. Moreover, when manipulating the data, a variable control on the amount of data allows the operators to satisfy their preference for speed and/or quality. To quickly view the processed results while adjusting numerous parameters, the operator suitably limits the amount of data 10 thereby increasing the refresh rate. To obtain high quality prints of the image, the operator suitably increases the amount of data thereby reducing the refresh rate, but increasing the image quality.

With continued reference to FIG. 4 (step 408), a power function $K_1$ is preferably applied to every incoming voxel intensity representation 10 within the grid of input buffer 9, thereby raising the value of the incoming voxel intensity representation 10 to the $K_1$ power. In a preferred embodiment, the implementation of the power function $K_1$ is suitably achieved through the use of a LUT 13 function. After applying the power function, the present invention suitably collapses a ray (z-component of digital data 10) into a single image by summing (into raysums) the intensities of a single viewpoint along the ray. More particularly, the slices are preferably reorganized into rays, whereby each ray contains one similarly situated voxel from each slice so that the intensity data 10 from each voxel contributes to the resultant intensity value in the final displayed image. The resultant intensity ($I'_{x,y}$ or "raysums") of each pixel in the resulting simulated image is preferably achieved by summing, in sum buffer 15, each of the intensity contributions from all of the slices (n) in the volume of digital data 10. The summing of the intensity contributions converts the three-dimensional array of data 10 into a two-dimensional array of sums (step 408).

More particularly with respect to the transformation of FIG. 4 (step 408), the power function is preferably implemented to speed the transformation of the incoming pixel values. However, applying the power function to each data point and summing all of the voxels in input buffer 9 is a very time consuming process. In the prior art, a shading algorithm, mathematical function and/or the like is typically applied to each voxel. The algorithm typically compensates for the shading effects from adjacent voxels, while each voxel typically compensates for every light source, wherein each light source includes a unique mathematical function. Instead, in a preferred embodiment, a simple precomputed LUT 13 and summation is suitably calculated for each voxel. For data sets 10 in which the number of voxels to be summed is greater than the range of values needed in the data volume, a precomputation of LUT 13 of the transformed values over the range of incoming values is preferable for decreasing the processing time (reduces the innermost loop of the computer program to an index operation and one addition). In the prior art, using a typical function to perform this transformation for each voxel typically requires substantially more processing cycles than simply, as in a preferred embodiment, using the value of the pixel, whereby the value of the pixel indexes an array of precomputed values. A LUT 13 buffer is suitably formed with all values in sum buffer 15 between the newly established minimum and maximum raysum values. For example, with a 12-bit display, 4096 possible values exist in a typical data 10 set. To conserve processing time, instead of applying an inverse exponential function to each of the 4096 data point 10 when needed, the present invention precomputes and indexes the inverse exponential function of all 4096 values within LUT 13. Therefore, the simple selection of the index quickly yields a precomputed value.

With continued reference to FIG. 4 (step 408), when summing the intensities along a ray, register variable 16 is preferably utilized. Register variable sum 16 is the variable which preferably stores the most frequently accessed variables. Due to the rearrangement of data 10 (as previously discussed), register variable 16 suitably registers each voxel along a ray until the entire ray path is complete. More particularly, for each pixel (x,y) in the output image, register variable sum 16 is suitably initialized with the first voxel (x,y,z) raised to the $K_1$ power. For the rest of the voxels (nslices −1) contributing to output pixel, the remaining voxels raised to the power $K_1$ are also preferably added to register variable sum 16. Once register variable 16 summed the entire ray, register variable sum 16 is preferably stored in sum buffer 15 at the pixel location corresponding to the raysum value. After storing the raysum value in sum buffer 15, a new register variable sum 16 is suitably started at a new pixel location in sum buffer 15. Thus, each pixel preferably contains the summation of all voxels along the z-axis of the (x,y) pixel location. The use of register variable sum 16 suitably limits the need to access sum buffer 15 memory and avoids having to overfill sum buffer 15 with every voxel value.

Furthermore, by substantially eliminating multiple passes, a single register 16 is preferably used to keep the current sum. In a single register 16, the actual value of the current sum is preferably stored in register 16 rather than an address of the memory containing the current sum. In other words, when summing the rays with single register 16, all of the slices for the voxels are traversed at a particular location.

Oftentimes, when summing the intensities, the intensity ($I_{x,y}$) of each pixel is further increased by a constant noise contribution ($N_f$), as seen in equation (1). The noise contribution is a function of the number of slices (n) in the digital data set, i.e. $N_f = k*\log(n)$. More particularly, a hologram is typically constructed by exposing each slice of an object to a source, whereby each exposure contributes noise to the resulting image. Each exposure often forms a different fringe pattern in the holographic emulsion for each imaged slice of the object and each fringe pattern typically includes a noise contribution. Consequently, each new exposure of the object typically contributes additional noise to the existing fringe patterns. Therefore, the noise contribution to each slice is often a factor when calculating the resultant intensity. However, in a preferred embodiment, because the noise contribution is minimal and to simplify the calculations, the noise contribution is assumed equal to zero.

With reference to FIG. 4 (step 410), after summing the intensity contributions, processor 11 suitably determines the maximum (brightest) value in sum buffer 15. In a preferred embodiment, the maximum value in raysum buffer 15 is determined by temporarily assigning the first raysum value as the maximum raysum value and storing the value in a maximum value register 17. Not only is the raysum value temporarily stored, but the location of the raysum value is also preferably stored in register 17. The temporary maximum value in maximum value register 17 is suitably compared to a second raysum value in a different location to determine if the second raysum value is larger. If the second raysum value is larger, the initial raysum value is preferably replaced with the larger value. Consequently, after comparing all raysum values, maximum value register 17 contains the maximum raysum value of the entire data set 5.

With reference to FIG. 4 (step 412), to obtain an accurate approximation of the changing parameters, the exponential curve must include the maximum intensity value. By accurately determining a maximum intensity value, processor 11 substantially ensures that the displayed image accurately approximates the actual features of the imaged object. In the prior art, averaging may not yield the true maximum value because simple averaging typically involves computing a fixed inverse exponential curve and guessing the location of the maximum value because the maximum value is an unrealistically high value. In a preferred embodiment, to obtain a substantially more accurate result than a simple average, the exponential curve is suitably constructed such that the exponential curve preferably contains the maximum intensity value. In a LUT 13 function, the maximum intensity value is part of the formula for computing the function for the exponential curve, thereby substantially ensuring that the exponential function will contain the maximum intensity value.

The exponential curve is preferably defined and limited by the maximum possible value in output buffer 19 and the maximum value in sum buffer 15. In a preferred embodiment, the maximum value is about 255. Because the maximum pixel intensity value is preferably located within the exponential function, the maximum pixel intensity is not affected by the power function; although, the maximum pixel intensity does have a measurable effect on the surrounding pixel intensities. The remaining values in raysum buffer 15 are all substantially located on the exponential curve and the exponential curve is defined by the maximum value, so the maximum value affects the remaining values. The effect on the surrounding intensity values, however, is not represented in the surrounding intensity values. To adequately represent the effect on the surrounding pixel intensities, the inverse power function suitably differentiates the intensity values of each pixel by acting as a weighting factor for the intensity values, thereby transforming the surrounding pixel intensities. Furthermore, if the pre-processing results in the cropping out of the maximum pixel intensity, the inverse power function suitably selects a new maximum value while correspondingly transforming the respective surrounding pixel intensities. Thus, in a preferred embodiment, the inverse power function substantially ensures that the displayed image accurately approximates the actual features of the imaged object.

More particularly, with continued reference to FIG. 4 (step 412), normalizing sum buffer 15 by scaling involves matching each value of sum buffer 15 to inverse LUT 14. Using inverse LUT 14 (which includes logarithm values 0–255 in sequential order), a suitable search function determines the matches between sum buffer 15 and inverse LUT 14. In a preferred embodiment, a binary chop method is utilized as the search function whereby the search domain is continuously divided in half, thus limiting the search to about eight comparisons. In an alternative embodiment, a binary chop look-up function is utilized to accomplish the same result as an inverse power function, whereby an inverse power function suitably maps the summed values to a displayable intensity. A binary chop method suitably allows a user to quickly alter the window/level and limit the display to a specific region of interest. Because the depth of the binary search is preferably a variable (and depending on the number of bits in output display 22), the operator selects the options of speed and/or quality for the resulting display. For example, while the user is suitably moving the window, the depth can be "shallow". Once the user has stopped moving the window, a timer suitably triggers a full depth or "deep" binary search for maximum image fidelity. The binary chop method is often more efficient because the time to compute the inverse power is typically twice the time for the binary chop function. For example, the binary chop function reduces to at most 8 comparison routines (one for each bit of output buffer 19) for the mapping of output buffer 19 to an image of 256 intensity values.

With continued reference to FIG. 4 (step 412), assuming the noise function equal to approximately zero, the contents of sum buffer 15 from equation (1) are suitably normalized by the maximum resultant intensity value (the brightest resultant pixel ($I'_{x,y}$)). Because the dynamic range of the raysum grid from equation (1) is typically too large for the human eye to view on a monitor, normalization of the raysum values in sum buffer 15 limits the dynamic range of the raysum values to allow for adequate viewing. Normalizing the raysum values preferably includes scaling the raysum values by the maximum value for a known output range of 256 gray values (typical dynamic range of display image 22). By suitably applying an inverse exponential function (the $K_2$ root) to each raysum value, the normalized raysum grid is preferably transferred to output buffer 19. With reference to FIG. 4 (step 414), processor 11 suitably maps the values in output buffer 19 to a display 22 (i.e., CRT, printer and/or the like).

With reference to FIG. 4 (step 416), in a preferred second embodiment, controller 20 allows the operator to interactively set control parameters such as window, level, crop region and/or the like. If the operator applies a predefined protocol to an initial set of window and crop parameters, the time for determining a suitable set of control parameters is substantially decreased. After applying a predefined protocol, the number of acceptable control parameter combinations is reduced, so the operator does not need to view as many combinations of control parameters. Thus, the amount of time for finding the optimal set of control parameters is reduced.

With reference to FIG. 4 (step 418), when a cropping is suitably applied which includes fewer voxels than the original crop region, the perceived update rate is typically greater. The update rate is greater because fewer voxels exist which must be traversed when feeding back the results of the window and level for the specific crop region. On the other hand, the application of the window and level for the cropped out region is preferably delayed until the user has stopped changing the control parameters. In a preferred embodiment, after increasing the perceived update rate, the operator preferably focuses the application to the cropped region, thereby reducing the number of voxels that need to be considered in the interactive windowing part of the calculation. After updating the voxels which lie within the crop region (step 418), the operator next updates the window. Once the operator stops moving the control bars, computer system 12 suitably fills in the region outside the desired cropping area.

With reference to FIG. 4 (Loop 422), when the crop region is adjusted (step 418), the new exposed region is suitably re-checked (Loop 422) to determine if the exposed region's largest value is greater than its value in the previous region. The exposed region is checked because the newly exposed region of sum buffer 15 may now contain a value which is greater than the maximum value in the cropped region. If the largest value is greater, the normalization LUT 14 is suitably recomputed and preferably applied to sum buffer 15. If the largest value is not greater, the existing maximum re-normalization is applied to the exposed region. Afterwards, crop changes no longer include the previous maximum value because of the re-normalization, so a new maximum value is determined and a re-normalization is suitably computed for the new region.

With reference to FIG. 4 (Loop 424), when the window and level control parameters are modified by the operator, these new values are preferably used to update the transform represented by LUT 13 and Steps 408–414 are again sequentially preformed. With reference to FIG. 4 (Loop 426), when the selected view is changed, Step 406 preferably reads data from secondary storage 6 and maps it into 3-D storage buffer 9 such that the new view is suitably simulated after Steps 408–414 are sequentially preformed. With reference to FIG. 4 (Loop 420), once the operator substantially stops interacting with the volume, any new window values or new re-normalization maximums are suitably applied to the cropped out region as a background task. More particularly, computer system 12 preferably includes several queued up tasks, but only one, the foreground task, preferably runs at any one time. A background task is preferably a low priority task in the queue and is suitably allowed to run when the other more important tasks have completed. At any time during this background task, if the operator initiates a parameter change, the background task is preferably terminated and processing control reassigned to the appropriate loop.

With reference to FIGS. 5A–5D, exemplary volumetric imagery is shown, whereby each image is produced by different projection techniques using a CTA test data set consisting of 71 slices. Those skilled in the art will appreciate the substantially higher quality image produced by the present invention. It will be apparent to those skilled in the art that the foregoing detailed description of preferred embodiments of the present invention is representative of a method and apparatus for simulating digital data processing parameters within the scope and spirit of the present invention. Further, those skilled in the art will recognize that various changes and modifications may be made without departing from the true spirit and scope of the present invention. For example, the present simulation technique is not limited to holographic volumetric data 10 sets. In an alternative embodiment, the present simulation technique is applied to two-dimensional displays, i.e. computer displays, printed materials, etc. Other applications of the present simulation technique include geophysical exploration, volumetric scanning techniques (i.e. confocal microscopy) and any other application where a continuous volumetric field is measured or calculated. Those skilled in the art will recognize that the invention is not limited to the specifics as shown here, but is claimed in any form or modification falling within the scope of the appended claims. For that reason, the scope of the present invention is set forth in the following claims.

I claim:

1. A method of simulating a 2-D projection of a 3-D data set having digital data which comprises:
    (a) acquiring the digital data;
    (b) applying a power function directly to the digital data to yield a second data set;
    (c) adding a constant amount to the second data set to yield a third data set, wherein the constant amount is related to a noise value;
    (d) summing the third data set into a two-dimensional array of sums;
    (e) determining a maximum value of the array of sums;
    (f) scaling the array of sums by the maximum value to yield a normalized array;
    (g) applying an inverse power function to the normalized array to yield a second two-dimensional array; and
    (h) displaying the second two-dimensional array on a display device having a range of values.

2. The method of claim 1, further including the step of repeating steps (a)–(h) to simulate a different 2-D projection of the 3-D data set.

3. The method of claim 1, wherein the acquiring step comprises acquiring the digital data, wherein the digital data comprises a set of irregularly spaced 3-D points.

4. The method of claim 1 further including the step of scaling the second two-dimensional array to the range of values of the display device.

5. The method of claim 1, wherein the acquiring step further includes acquiring color digital data.

6. The method of claim 1, wherein the adding step further includes adding a noise value which is approximately equal to zero.

7. The method of claim 1, wherein the step of applying a power function further includes pre-computing a look-up table.

8. The method of claim 1, wherein the step of applying an inverse power function further includes using a binary search algorithm to apply the inverse power function to the array of sums.

9. The method of claim 1 further including the step of removing data from the array of sums prior to the step of determining a maximum value.

10. The method of claim 1 further including the step of adding data to the array of sums prior to the step of determining a maximum value.

11. The method of claim 1 further including the step of simulating a second 2-D projection to simulate a stereo view.

12. The method of claim 1, wherein the acquiring step comprises acquiring the digital data, wherein the digital data comprises a plurality of 2-D data slices.

13. The method of claim 12, wherein the acquiring step further includes acquiring a plurality of 2-D data slices that are non-parallel.

14. The method of claim 12, wherein the acquiring step further includes acquiring a plurality of 2-D data slices spaced along an axis, wherein the spacing along the axis is substantially uniform.

15. The method of claim 12, wherein the acquiring step further includes acquiring a plurality of 2-D data slices spaced along an axis, wherein the spacing along the axis is non-uniform.

16. The method of claim 12, wherein the acquiring step further includes acquiring a plurality of 2-D data slices, wherein the 2-D data slices may vary in size.

17. The method of claim 12 further including the step of applying a gantry tilt correction to each of the 2-D data slices.

18. The method of claim 12 further including the step of independently windowing the digital data prior to the step of applying a power function directly to the digital data, wherein the step of independently windowing comprises applying an intensity transform to each slice of the digital data, wherein the intensity transform varies and is a function of the position of the 2-D data slice.

19. The method of claim 18, wherein the windowing step further includes differential windowing within at least one of the 2-D data slices.

20. The method of claim 12, wherein the acquiring step further includes acquiring a plurality of 2-D data slices, wherein each of the 2-D data slices has a thickness.

21. The method of claim 20, wherein the acquiring step further includes acquiring a plurality of 2-D data slices, wherein the thickness of the 2-D data slices varies within the 3-D data set.

22. The method of claim 20, wherein the acquiring step further includes acquiring a plurality of 2-D data slices that are overlapping such that the thickness of each 2-D data slice is greater than a separation between adjacent 2-D data slices.

23. The method of claim 1, wherein the acquiring step further includes limiting the digital data, thereby increasing the speed of the applying a power function step, by at least one of processing a smaller number of slices, reducing a size of each image and a slabbing technique.

24. The method of claim 23, wherein the slabbing technique comprises one of slabbing by a MIPing function and slabbing by a mean threshold function.

25. The method of claim 1, wherein the step of applying a power function further comprises applying a power function according to the equation $((I_{x,y}{}^{K}{}_{1}+N_f)/(\max_{x,y}((I_{x,y}{}^{K}{}_{1}+N_f))))^{1/K}{}_{2} \times R$, wherein I comprises an intensity of said 3-D measurement data, $N_f$ comprises said constant amount, and R comprises a dynamic range of said display device.

26. The method of claim 25, wherein the step of applying a power function, $K_1$ and $K_2$ each have a value in the range of 2.8–5.0.

27. The method of claim 25, wherein the step of applying a power function, $K_1$ and $K_2$ have equal value.

28. The method of claim 25, wherein the step of applying a power function, $K_1$ and $K_2$ have a value approximately equal to 3.2.

29. The method of claim 25, wherein the step of applying a power function, $K_1$ and $K_2$ have an integer value.

30. The method of claim 1 further including the step of windowing the digital data prior to the step of applying a power function directly to the digital data, wherein the step of windowing comprises applying an intensity transform to the digital data.

31. The method of claim 30, wherein the step of windowing further includes pre-computing a look-up table.

32. The method of claim 30, wherein the step of windowing the digital data further comprises storing windowing parameters as a preset list to enable rapid selection.

33. A computer readable program that simulates a 2-D projection of a 3-D data set having digital data, the computer readable program configured to cause a computer to perform the following method:
  (a) applying a power function directly to the digital data to yield a second data set;
  (b) adding a constant amount to the second data set to yield a third data set, wherein the constant amount is related to a noise value;
  (c) summing the third data set into a two-dimensional array of sums;
  (d) determining a maximum value of the array of sums;
  (e) scaling the array of sums by the maximum value to yield a normalized array;
  (f) applying an inverse power function to the normalized array to yield a second two-dimensional array; and
  (g) displaying the second two-dimensional array on a display device having a range of values.

34. The computer readable program of claim 33 further configured to cause a computer to repeat steps (a)–(g) to simulate a different 2-D projection of the 3-D data set.

35. The computer readable program of claim 33 further configured to cause a computer to simulate a second 2-D projection to simulate a stereo view.

36. The computer readable program of claim 33 further configured to cause a computer to acquire the digital data, wherein the digital data comprises a plurality of 2-D data slices.

37. The computer readable program of claim 33 further configured to cause a computer to perform the step of applying a power function, wherein the step of applying a power function further comprises applying a power function according to the equation $((I_{x,y}^{K_1}+N_f)/(\max_{x,y}((I_{x,y}^{K_1}+N_f))))^{1/K_2} \times R$, wherein I comprises an intensity of said 3-D measurement data, $N_f$ comprises said constant amount, and R comprises a dynamic range of said display device.

38. A computer readable program that performs a real-time simulation of digital information which can be applied to holography, the computer readable program configured to cause a computer to perform the following method:
  acquiring 3-D measurement data, wherein said 3-D measurement data includes a header;
  applying a power function directly to said 3-D measurement data to yield a second data set;
  adding a constant amount to said second data set to yield a third data set, wherein said constant amount is related to a noise value;
  summing said third data set into a two-dimensional array of sums;
  determining a maximum value of said array of sums;
  scaling said array of sums by said maximum value to yield a normalized array;
  applying an inverse power function to said normalized array to yield a second two-dimensional array; and,
  displaying said second two-dimensional array on a display device having a range of values.

* * * * *